United States Patent [19]

Teske et al.

[11] Patent Number: 4,912,709
[45] Date of Patent: Mar. 27, 1990

[54] FLEXIBLE VLSI ON-CHIP MAINTENANCE AND TEST SYSTEM WITH UNIT I/O CELL DESIGN

[75] Inventors: Judy L. Teske, Burnsville; Daniel J. Baxter, St. Paul; Don A. Daane; Brian D. Borchers, both of Burnsville; David H. Allen, Eagan; Michael F. Maas, Maplewood, all of Minn.

[73] Assignee: Control Data Corporation, Minneapolis, Minn.

[21] Appl. No.: 112,920

[22] Filed: Oct. 23, 1987

[51] Int. Cl.$^4$ .................................... G01R 31/28
[52] U.S. Cl. .................................... 371/22.1; 371/22.3
[58] Field of Search .................... 371/15, 25, 37, 22.1, 371/22.3; 324/73 R

[56] References Cited

U.S. PATENT DOCUMENTS

| | | | |
|---|---|---|---|
| 4,594,711 | 6/1986 | Thatte | 371/25 |
| 4,601,033 | 7/1986 | Whelan | 371/25 |
| 4,601,034 | 7/1986 | Sridhar | 371/25 |
| 4,670,877 | 6/1987 | Nishibe | 371/15 |
| 4,701,916 | 10/1987 | Naven et al. | 371/15 |
| 4,701,920 | 10/1987 | Resnick et al. | 371/25 |
| 4,764,926 | 8/1988 | Knight et al. | 371/25 |

OTHER PUBLICATIONS

Konemann, et al., Built-In Test for Complex Digital Integrated Circuits, Fifth European Solid State Circuits Conference, ESSCIRC 79, Southampton, England, Sep. 18-21, 1979, pp. 89-90.

Zobniw, Production Signature Analysis with Relaxed Design Constraints, IBM Tech. Discl. Bulletin, vol. 24, No. 7A, Dec. 1981, pp. 3323-3327.

Hanson, III, High Speed Signature Analysis, IBM Tech. Discl. Bulletin, vol. 26, No. 3A, Aug. 1983, pp. 974-975.

Primary Examiner—Charles E. Atkinson
Attorney, Agent, or Firm—Robert M. Angus; Michael B. Atlass; Frederick W. Niebuhr

[57] ABSTRACT

This application describes a peripheral cell structure for VLSI chips that requires the use of standard cells having both input and output capability connected to nearly all of the signal carrying pins. The cells function is alterable (to input or output and to where the data input signals originate) by control signals which may originate with a control register. The clock input signal is split into two independent signals to selectively disable the input or output registers, thus allowing the control register to be changed without affecting the contents of the other two registers. An early signal is also provided to prepare for mode changes.

15 Claims, 5 Drawing Sheets

FLEXIBLE VLSI ON-CHIP MAINTENANCE AND TEST SYSTEM WITH UNIT I/O CELL DESIGN

The following U.S. patent application Ser. Nos. are commonly owned, filed on even date herewith, and have identical specifications. These applications claim different inventions. Their serial numbers are 112,921, 112,968, 112,916, and 112,915. Ser. No. 112,915 has issued as U.S. Pat. No. 4,771,251.

This invention relates to improvements in VLSI testability and standardized chip design.

BACKGROUND

Testability is a concept which can be described as an improvement in Very Large Scale Integrated circuit design which enhances the ability of the chip manufacturer, the original equipment manufacturer who installs the chips on a circuit board, and the end user, to determine the adequacy of a particular piece of integrated circuit to perform the task it was designed for. Testability can be seen as having several components, including performance characteristics such as speed and consistency of throughput, consistency of throughput in the face of changing environmental conditions, correct performance of particular logic gates and combinational logic structures, correctness of the physical design in terms of whether and how true it is to the logical design characteristics specified, etc. The enhancements and features described in this application work together as a system to provide improvements in testability and, at the same time, provide for more efficient use of available semiconductor area ("silicon real estate"). Testability at the chip level can support module, board, or system level testability.

Different varieties of test systems have been built into Large Scale Integrated (LSI) and Very Large Scale Integrated (VLSI) circuit chips to improve testability. One particular example includes the patent issued to Lyon, U.S. Pat. No. 4,660,198, built specifically for detecting data errors at the earliest point that an error occurs in a combinational logic processing stream. This finds the errant logic by capturing data output from any point in the processing stream based on the first error found.

A different scheme for building testability into chips is described in Van Brunt, U.S. Pat. No. 4,357,703. Van Brunt contemplates the use of a control register for controlling the transmission gates (10, 23, 13, and 32), the operand generator and accumulator (22), and the output generator and accumulator (34), in order to control the input to the main function under test (11) and direct its output for analysis. Test data is input through the control shift register and the test is controlled through the test control input. As chips become more complicated and larger, it becomes helpful to include things like specialized flip-flops for holding test operands as they progress through complicated internal logic segments deep within the chip. Such a system is described in U.S. patent application Ser. No. 046,218 now abandoned.

Scan testing of various kinds besides the ones described in this invention can be used with this invention, and they can easily be implemented without consuming additional I/O pins. For a discussion on scan designs see Testing Semi-Custom Logic by McClusky, Semiconductor International, September 1985 pp. 118-123 and Built In Self Test Techniques, McClusky, 1985, April IEEE Design & Test pp. 21-36.

Some of these and other design features and use considerations for testability are described in the articles "A Fast 20K Gate Array With On-Chip Test System" by Ron Lake in *VLSI System Design*, June 1986; "Checking Out VLSI With Standard Test Gear" by David R. Resnick, published in *Electronics*, May 26, 1986; and "Testability and Maintainability With a New 6K Gate Array" also by David Resnick in *VLSI Design*, March/April 1983. The information contained in these articles is incorporated herein by this reference.

As the number of gates in a VLSI chip goes up and as they become more and more application-specific in design, the need for simple, consistent testability characteristics becomes more and more important.

Along with testing for the correctness of logic, process characteristics which affect performance (such as variations in capacitance and resistance) can and should also be tested for.

SUMMARY OF THE INVENTION

Described is a system which is geared primarily to providing improvements in testability of Very Large Scale Integrated circuits. All of the components of the system work together to provide improved performance, enhanced flexibility, and added features. Featured are a ring oscillator distributed around the periphery of the VLSI chip for measuring performance characteristics; a unit I/O cell design connected to each signal pin and located around the periphery from which are built the serially connected, input register (IR), and output register (OR), (connected in that order); extra register flip-flops (some of which are "dummy" or "filler" flip-flops for increasing the length of a register, and some of which are Control Register flip-flops) are provided in a serial path, the Input Register and Output Register are serially linked and form a boundary scan test structure, and the clock provided to the IR and OR are decoupled from the Control Register's clock. Test Strobe (TST) and Test Clock Enable (TCE) inputs to the chip are also provided in latched and early forms for enhanced functionality. Measurement of clock skew may be made from within the user customizable central logic area (also called the core logic area) by using a clock monitor pin. An optimized operand generation scheme for the input register is described. A new checksum generation scheme for the output register is explained. Use of a control register to control on-chip test and maintenance functions is also described.

In all references to flip-flops, the invention may be implemented with static or dynamic flip-flops or latches of various kinds as dictated by the design.

DETAILED DESCRIPTION OF THE PREFERRED EMBODIMENT

Unit I/O Cell Organization and Chip Design Overview

Figure 1:
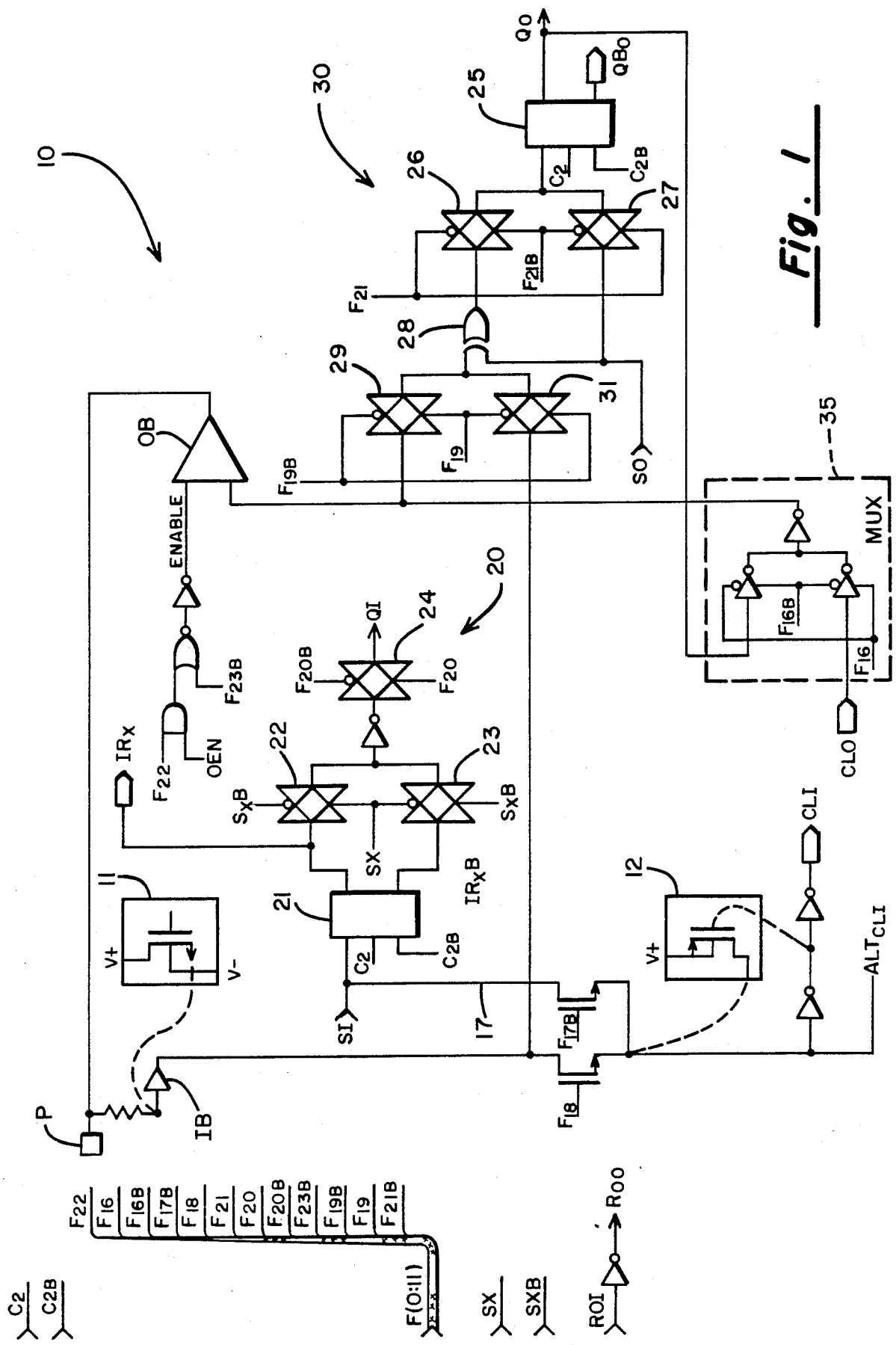
FIG. 1 is a logic diagram illustrating the I/O cell used in the preferred embodiment.

Communication from the world outside the chip with the innards of the preferred embodiment chip is through pins like pin P in FIG. 1, which illustrates the standard cell input/output logic. These input/output cells (I/O cells), are principal components of the test system. The Input Register and Output Register are built from them. The Application Specific Integrated Circuit (ASIC) which contains the preferred embodiment is physically about 420 mils on a side and has roughly 20,000 user customizable gate equivalents. It uses 240 unit I/O cells for attachment to pins and is configured to have 249 Input Register (IR) bits and 241 Output Register (OR) bits. A Control Register (CR) having 24 elements is also used; it is linked to the Test Data Input pin for its input. The CR is serially linked to the least significant or first bit of the IR. Different logically or physically sized chips or chips of limited or expanded function may require more or fewer pins or register elements as those described with reference to particular structure described herein without deviating from the teachings of this patent. Each one of the pins connected to unit I/O cells can be described as the P in FIG. 1, its input buffered by Input Buffer IB.

All normal (non-test and non-maintenance) operational communication to the outside world goes through these unit I/O cells. System design is thus easier since all signal pins are capable of input and output, not just input or just output as is the case in other systems where these limitations are cast in silicon before the ASIC designer may begin his work. In the preferred embodiment there are also 8 pins (called VISTA pins) dedicated to testing which do not use unit I/O cells. These are Test Clock Enable (TCE), Test Strobe (TST), the system clock input (which after buffering is refered to as CLK0), Ring Oscillator Output (ROO), Ring Oscillator Enable (ROE), Clock Monitor (CKM), Test Data Input (TDI), and Test Data Output (TDO). The functions of these are explained later.

Power and Ground pins also do not use unit I/O cells. In the preferred embodiment 296 pins are used in total; 240 for signal pins, 8 for VISTA pins and 24 each for power and ground.

The I/O cell provides input to the core logic of the chip through the Core Logic In (CLI) output from the circuit 10 and accepts output from the core logic at the Core Logic Out CLO input point to the circuit 10. The input register element and output register element are illustrated as subunits 10i and 10o of the circuit 10. Inserts 11 and 12 are provided for expansion of the diagram to show additional circuit elements used for the proper electrical functioning of the circuit which cannot be used with our software for testing logic to confirm the design's functionality. The F inputs at the left side of FIG. 1 act individually and in concert to functionally activate circuit 10 to perform its numerous functions. The F signals are derived from control register (CR) output. A full explanation of these F signals is provided under the detailed description of Control Register functions below.

Thus, to enable the Core Logic Output (CLO) to pass through the pin P described with reference to the I/O cell here, the functions F16 and F16B (the inverse of F16), functions F22 and F23B, and the output enable line OEN, must all cooperate. Likewise, to enable the input from P to arrive at the Core Logic In CLI, F18 must be active.

Input SI stands for serial input, which is the output of the next previous input register bit. The circuit 20 may be considered an input register bit having its information stored in flip-flop 21. The remainder of the circuit 20 following register element 21 operates an XOR gate, allowing only IRX or SX to pass as the output signal at Q1. This XOR gate structure is used to implement the operand generation scheme described in that section below. The SX and SXB inputs are either received datum outputs from more significant Input Register IR bits or hardwired as SX-active/SXB-inactive, as will also be explained in greater detail in the IR operand generating scheme section. The "X" designation indicates an undeclared but specific register bit number.

Note that the FIG. 1 signal lines designated with Q indicate output to the next element connected serially. S designators indicate input from a preceding serially connected element. The SX designations do not follow this convention, being derived from a "hardwired" signal (always high or low) or being derived from a more significant bit in the serially connected register.

The positive and negative outputs of the flip-flop 21 IRX and IRXB go to transmission gates 22 and 23, respectively. These gates, along with gate 24 and other gates of similarly drawn symbolic design, are considered to be active (allowing the data input to proceed forward) when the upper (control) input is negative or zero and the lower control input is positive or one. The data input to gate 22 also may be provided to the on-chip logic as $IR_x$. An inverted output is provided as the serial input to the next input register bit at output Q1 after gate 24.

The Output Register (OR) 30 is similarly configured. Again, off-chip output is available at pin P, from output buffer OB. If the "enable" to output buffer OB is activated, then the output from circuit 35 will appear at pin P. If the pin's output is to be the output register element circuit 30, the QO output would be gated out by signal F16B. The flip-flop, or register element, is circuit 25 and the inverted output is also provided at QBO. F21 and F21B are the signals which control gates 26 and 27, which provide the input to circuit 25. Based on the signal from F19 and F19B, the gates 29 and 31 will selectively provide one input to XOR (exclusive OR) gate 28. The output from the next preceding output register element bit (SO) provides the other input to XOR gate 28. XOR gate 28's output is provided to gate 26, and the SO input is provided to gate 27. Signals F21 and F21B determine whether gate 26 o 27 are on.

Mention should be made here that an input on line 17 can be used as an input to circuit 21, depending on the configuration of signals F20B and F20 of gate 24 of the next preceding input element bit circuit. Signals F18 and F17B also must allow this transmission. Signal F18 also provides the "alt CLI" and "CLI" inputs to the chip core logic with the information provided at P or with the information provided from the next preceding QI (SI in this figure).

Thus, by using a single cell for both input and output functions this design achieves ease in layout, flexibility for different designs, the ability to have input and output registers with larger or smaller numbers of elements, and allows that the location of these registers need not be predetermined. This design also avoids ground bounce and other analog problems.

Ring Oscillator

Figure 2:
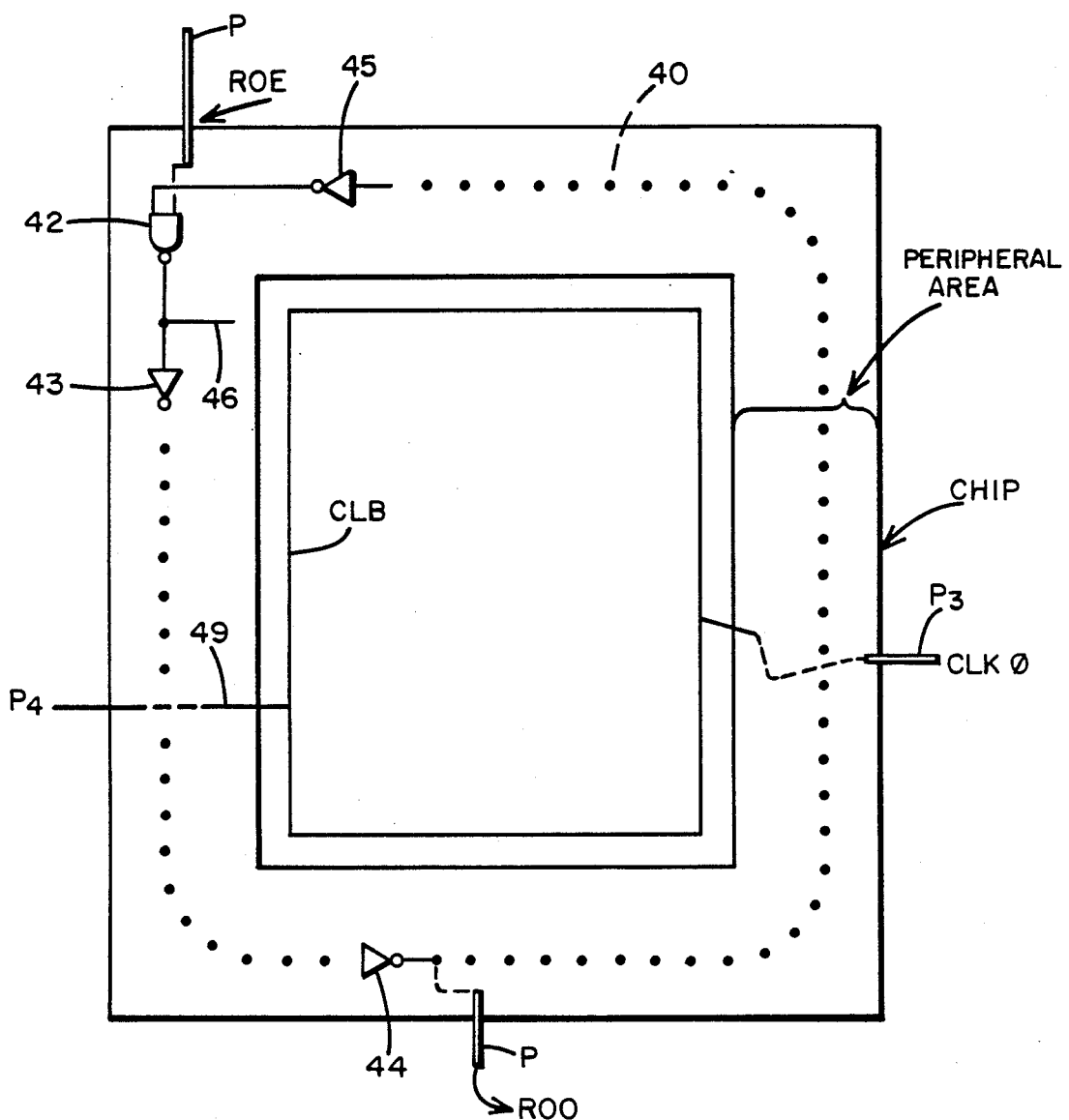
FIG. 2 is a logic diagram illustrating the organization of the ring oscillator used in the preferred embodiment.

FIG. 2 describes the ring oscillator circuit of the preferred embodiment. The circuit 40 is stretched around the periphery of the VLSI chip C so that manufacturing process variations which occur across the surface of the chip will be averaged out. The ring oscillator circuit 40 is only partially illustrated to show only the features relating to this invention and to avoid drawing the hundreds of identical inverters used in the preferred embodiment. The circuit requires an odd number of gates or inverters and the initiation pulse should come from a pin P which provides the Ring Oscillator Enable signal ROE. The initiation pulse starts the oscillation and the rate is measured. The variation in oscillation rate provides a measurement of the quality of the manufacturing process across the entire chip surface. This measurement is a predictor of actual chip performance.

To get best results the transistors used in the ring oscillator elements should be of the same size as those used in the core area. Previous designs for ring oscillators used circuit elements of a size different from those used in the core area. Previous Ring Oscillator designs sampled only a small localized area of the chip, giving an unreliable measurement of overall process characteristics. This patent's ring oscillator circuit provides a better means for measuring chip performance than previously available, where only a small, localized, portion of the chip was tested. Because they used elements of a different size than the elements used in the core area, the measurements were of limited usefulness for that reason as well. An initialization input ROE to a NAND gate 42 provides the initial pulse to start the circuit in motion. An odd number of inverters (even number plus the NAND gate 42) cause the circuit to continuously oscillate. The rate of oscillation can be monitored at an output pin closest to the inverter used for monitoring it. In this case inverter 44 provides the Ring Oscillator Output ROO at pin P. A different inverter output (including the NAND gate) could be used, but in the preferred embodiment a particular gate close to a particular pin is chosen for all ASIC variations.

A ring oscillator element is shown on FIG. 1 also because it is built out of an area which includes the I/O cell at the chip periphery. Note that to improve accuracy of this ring oscillator an additional set of metal lines which add parasitic capacitance to the ring is added to the circuit to increase loading. This will better approximate the conditions in the core of the chip where more loading is usually present. These lines are simply strips or pieces of metal, polysilicon, or other conductive material 46 with no connection to other circuits on the chip.

In FIG. 1, the ROE signal enables the ring oscillator. It provides an input which is available to the core but which does not use a unit I/O cell. The pin input also is available, in the preferred embodiment, to enable the scan mode of the registers used in scan mode or may be used for other purposes.

New Operand Generation Scheme for the Input Register

In testing chips using this invention, a sequence of pseudo-random numbers is generated in the input register by initiating a "seed" input through the least significant bit of the register and propagating it through the entire register. The seed is propagated through the chain of registers (CR-IR-OR or IR-OR). After loading, when the chip is set in pseudo random generator mode, the Input Register will generate a new pseudo random input to the core logic on each subsequent clock. Thus, the input register creates input operands for pushing into and through the logic of the chip to test that logic for faults. To detect certain faults, called sequential faults, signal independence of serially adjacent bits is required. For instance, if the input operand at some location has serially connected bits 0,0, the next clock cycle the second bit will always be 0, though the first could be 1 or 0. Thus on a given clock cycle, the second bit is dependent on the first bi's status from the previous clock cycle. For example, the sequential patterns of 0,0, followed on the next clock by 0,1, or by 1,1 are impossible. Similarly, sequential dependence can be found between bits that are separated by some bit, with sequential dependency occurring every two clocks. In general, such sequential dependency can be found for flip-flops separated by n bits at n clock cycles. Without independence between adjacent bits certain sequential faults cannot be detected.

In prior art the most significant bit and some subset of the input register bit outputs are fed back to bit zero (the least significant or first bit) through an XOR (exclusive OR gate) tree. The larger the number of such feedbacks, the more gate delay time it takes to push them through the XOR tree. Since the operand created by the input register would only be serially independent at the bit zero, there is a great probability that needed sequential patterns (such as 0,0 followed by 0,1 or 1,1) will not be capable of being generated. In this invention, four serially connected flip-flop outputs are fed back to approximately one-third of the other flip-flops.

These feedback inputs appear as SX and its complement SXB. The flip-flop output is QI. The input is XORed with the output IRX of the flip-flop 21 as explained with reference to the I/O all above. The overall structure with reference to operand generation is more easily understood with reference to FIG. 4.

Figure 3:
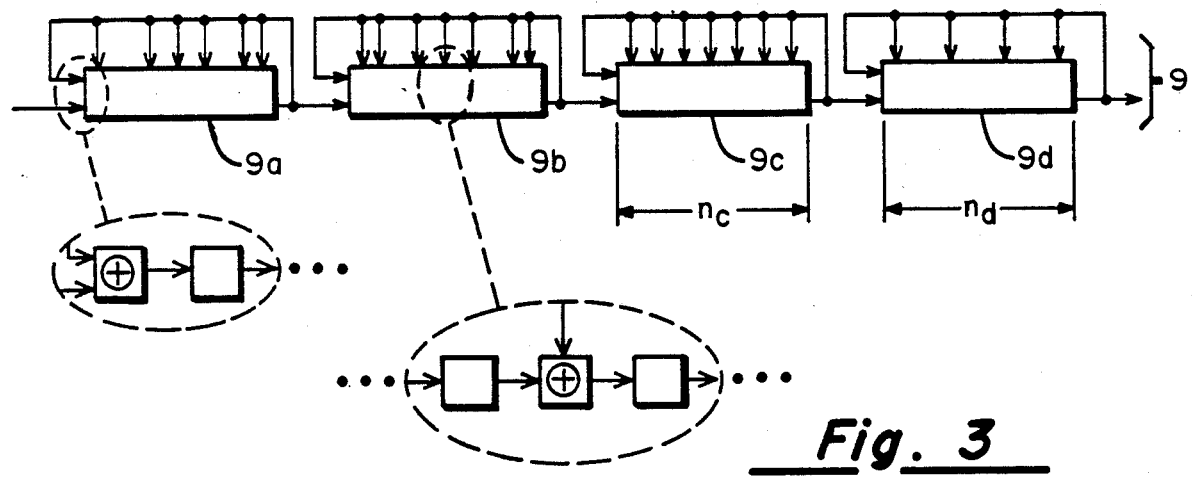
FIG. 3 is a logic diagram of the input register as used in the preferred embodiment.

Referring now to FIG. 3, which illustrates the preferred embodiment solution, the input register 9 is broken up into subunits 9a, 9b, 9c, and 9d. The length of these register parts is n bits which must be a different n for each segment. Each segment has calculated for it a maximum length polynomial which generates a maximum sequence before repetition of $2^n - 1$. The polynomial is implemented through the feedbacks through the XOR gates as indicated. For the preferred embodiment having 249 input register bits broken into segments of lengths 67, 63, 64, and 55, in order, the polynomials are (in Hexidecimal) 9,48D0,BB21,1442,3701 for segment 9a, C41C,4509,8E22,1221 for segment 9b, 1,4594,4488,B121,2351 for segment 9c, and 94,4093,424A,4945 for segment 9d; which means feedback from the most significant bit of each segment goes to bits 0, 3, 5, 8, 12, 13, 15, 20, 24, 26, 27, 30, 35, 39, 41, 45, 50, 54, 55, 57, 58, and 59 of the first segment 9a, bits 67, 68, 72, 78, 79, 80, 84, 88, 90, 95, 98, 99, 103, 104, 105, 109, 113, 118, 121, and 125 of the second segment 9b, bits 130, 132, 136, 138, 139, 142, 144, 148, 152, 155, 159, 163, 165, 166, 170, 173, 178, 181, 185, 186, 188, and 190 of the third segment 9c, and bits 194, 197, 199, 203, 210, 213, 216, 217, 219, 224, 227, 230, 232, 235, 238, 241, 243, and 247 of the fourth segment 9d. (Going to some enumerated bit as described in the above sentence means being XORed with the output of the next previous bit except in the case of bit zero which can be XORed with Test Data Input or any other consistent signals as desired by the designer.) In general, by feeding back to an optimal one third (or an optimal two thirds) of the flip-flops in each segment, approximately one third of the adjacent (or one bit/cycle sequential dependencies) are broken up. A much greater proportion of higher dependencies will be broken up. (If two thirds is used the same effect is felt because of realignment of dependencies.) Of course, this one third is not achievable in an even number of bits, so an approximate one third is used.

Any series of some number of segments of predetermined length using a maximum length polynomial to describe the feedback could be used and be within the scope of this invention. How to generate these polynomials is common knowledge in the Error Correction Code art. However, it should be noted that each segment must have a figure of $2^n-1$ which is relatively prime vis-a-vis the $2^n-1$ of the other segments.

Dummy bits are added as necessary to the input register to make the requirements for operand generation stated above feasible. These could be formed as serial shift register elements unconnected to pins as in the preferred embodiment.

It is also preferred to have the largest segment first to obtain maximum sequential randomness.

It was previously known in the error correcting code (ECC) art that by feeding an operand through certain polynomials, a maximum sequence of $2^n-1$ non-repeated value states could be achieved for an n bit register. Such a polynomial has been implemented in a circuit similar in style to the one disclosed here for the preferred embodiment input register operand generator as just described. It was also previously known in the ECC art that such feedbacks to either one or two thirds of the bits in the shift register resulted in a pseudo-random generator having maximal sequential entropy (randomness).

Figure 4:
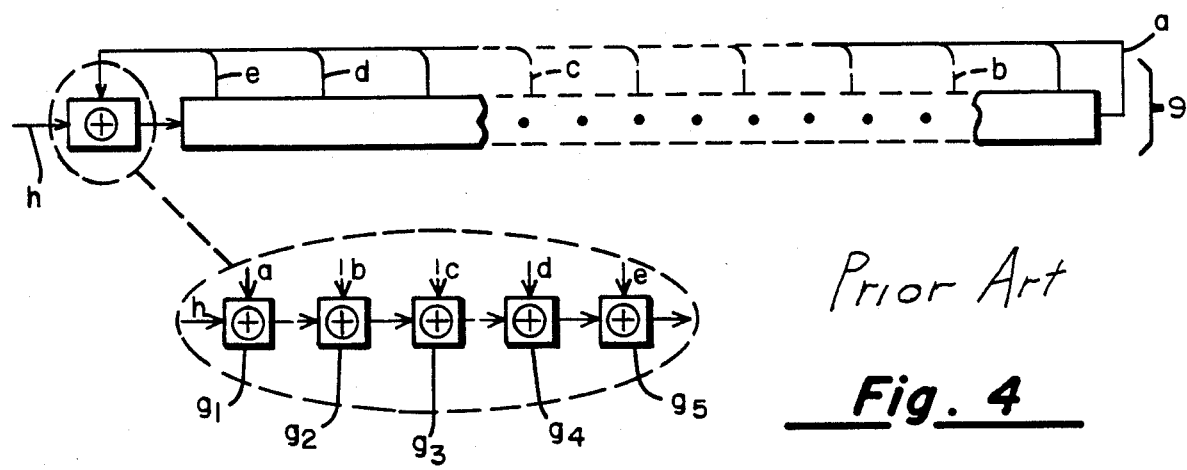
FIG. 4 is a logic diagram of a prior design for an input register.

Referring now to FIG. 4, in which the old design is illustrated, a number of outputs from the bits of register 9 are fed back through lines a, b, c, d, and e, into XOR tree g. Input h is also provided to the XOR tree as shown. These outputs are XORed to produce a randomized output on line h to be fed back to the least significant bit, zero, of input register 9. An expanded version of the XOR gate is shown in the blowup attached to FIG. 4, showing that in this instance, XOR tree is composed of XOR gates g1, g2, g3, g4 and g5. (Numerous other XOR gates identically positioned in line are not necessary to explain the concept and are not shown.)

Note that since no large XOR tree is used in this invention, all XOR operations occur in the minimum gate delay time (within one gate delay). This speeds up the maximum rate at which the input register can be clocked, thus increasing test operation speeds.

New Check Sum Generation Scheme for the Output Register

Output registers are used to hold the output of the chip logic elements under test immediately before providing output to be analyzed. When outputs from several cycles are merged via a logical operation such as parallel XORing, addition, subtraction or other mathematical operation, the process is known as checksum generation. In the preferred embodiment, the output register is implemented as a serial shift ring, (i.e. the most significant bit is fed back to the least significant bit with the output of each cycle XORed with the checksum of the previous cycle shifted one bit toward the most significant bit). If a bit in the output register becomes corrupted due to an error in the logic or for some other cause within the chip, that bit will remain corrupted for many clock cycles as it is shifted through the output register. However, there is a possibility that another error will flip a corrupted bit to incorrectly form what appears to be an uncorrupted output signature. This is known as aliasing. (Another aliasing problem occurs when the error is looped back and recurs at the same location, when it is returned there by the serial shift loop.) Thus, to avoid aliasing of the check-sum value in the output register, bits 2, 11, and of the output register are provided in the preferred embodiment as input to bit zero through an XOR tree to perform the a cyclic redundancy check operation. Thus bits 0, 2, 11 and the bits in-between form a 12 bit cyclic redundancy check generator as a segment of the output register. The most significant bit is also fed back through the XOR tree) to bit 0 to make the whole output register a ring.

This problem has been reduced in prior designs by using the entire output register as a cyclic redundancy check generator using a huge XOR tree similar to that described in FIG. 4 for the input register. Here, of course, we are talking about the output register which is a linear serially shifted register. However, by realizing that only a small section of the output register is needed to perform the cyclic redundancy check (bits 0–11) or be implemented as a linear feedback shift register, only two bits of feedback are used in the preferred embodiment. The most significant bit is also fed back to form the cyclic ring.

Figure 5:
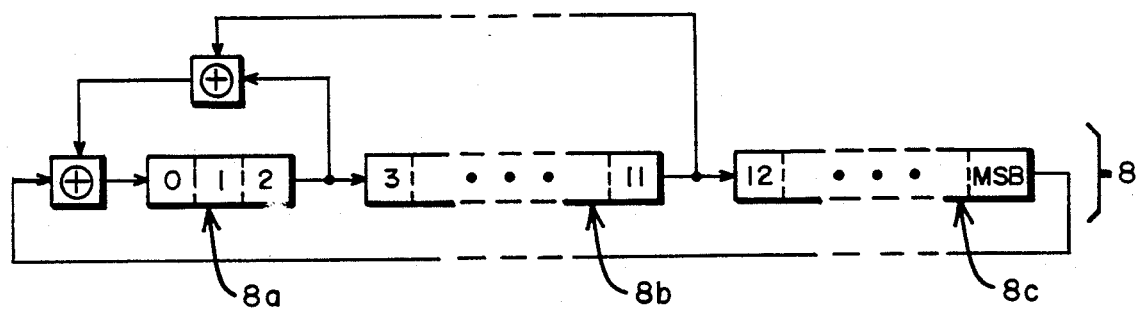
FIG. 5 is a logic diagram of the output register used in the preferred embodiment.

FIG. 5 describes the preferred embodiment in diagram form showing the output register 8 to be comprised of three parts, 8a, 8b, and 8c, having for the first part register bits zero, one, and two; for the second part bits 3 through 11; and for the third part bits 12 through the most significant bit.

The output register is cycled numerous times before the test data in it is read out. It takes numerous clock cycles to get needed test data patterns through all the testable logic in the chip. The occurrence of an aliasing problem during the first cycle will not be discoverable with the preferred embodiment. Nevertheless, the inclusion of the above-described or a similar cyclic redundancy check generator as shown will greatly reduce the loop-back form of aliasing entirely and also greatly reduce the chance of recorruption of same bit to hide a bad signature anywhere it may occur especially after the first cycle because the corrupted bit is subject to the XORed feedback.

Control Register Function Without Input or Output Register Function

Figure 6:
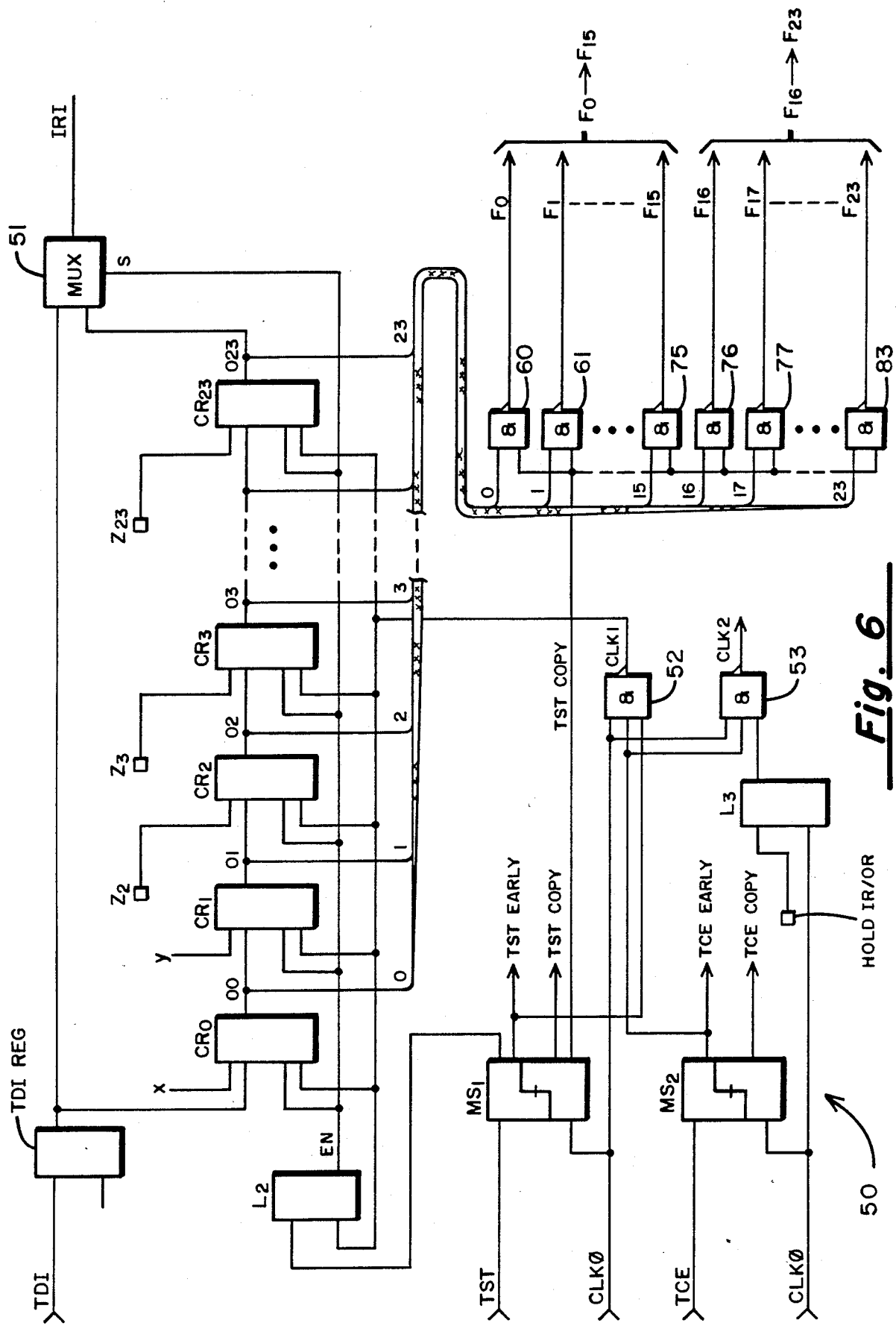
FIG. 6 is a logic diagram illustrating the control register used in the preferred embodiment and showing its association with clock, TST, and TCE signals.

In FIG. 6, five bits of the control register are shown, CR0, CR1, CR2, CR3, and CR23. The flip-flops CR0–CR23 are shown, each having four input lines, one from flip-flop L2, one from signal CLK1 and two data lines. Inputs w and y are hardwired 0 or 1 inputs and inputs $z_{2\text{-}23}$ are hardwired in a chip identification sequence of 0's and 1's, which may be unique to each ASIC.

The enable (en) input is a select line allowing either the hardwired input line (w,y, or $z_{2\text{-}23}$) or selecting the output of the flip-flop TDI reg to be received as input to the flip-flop CR0 and the outputs of the previous Control Register bits for CR1-23. The C2 input is the control register clock input. The output from each (o0, o1, o2, o3, ... o23) is serially shifted into the next flip-flop (CR0-CR23) as input. Either the output from CR23 or the output from TDI reg may be selected by the output from L2. The flip-flops CR0-CR23 are called "muxed flip-flops," i.e., a multiplexor followed by a flip-flop. As mentioned previously, any mention of flip-flops indicates use of a data holding element, such as a latch, R-S flip-flop, etc. This also applies to the claims.

The Input Register Input (IRI) Signal provides output from the TDI signal or output from the most significant bit of the Control Register CR23. The IRI signal is available as input to the first bit of the Input Register.

At the first clock cycle after a checksum operation is complete, the data on x,y, and $z_{2-23}$ are clocked into the Control Register by the first clock of the shifting off operation. The shifting off operation serially shifts data out through the last bit of the Output Register and through the TDO output.

The test strobe enable signal TST is fed to MS1 from off chip and its inverse signal is passed through without clocking by the master part of the master slave flip-flop MS1.

The test clock enable signal TCE is fed to MS2 from off chip and its inverse signal is passed through without clocking by the master part of the master slave flip-flop MS2.

Both these TST and TCE "early" signals provide input to AND gate 52. On the occurrence of a system clock pulse on CLK0, this gate 52 produces the control register clock CLK1, which clocks the control register flip-flops, CR0-23.

The TST and TCE early signals may be used for other purposes as well. For example, the receipt of these signals by core logic prepares the core logic for test mode in the preferred embodiment by initializing all of it to a known state before receipt of the actual signals.

The other clock signal, CLK2, is produced by AND gate 53. This AND gate requires the system clock signal on CLK0 and the presence of the test clock enable TCE "early" signal but it also requires that the signal HOLD IR/OR not be active at the input to the hold latch L3 in order to produce a high signal as output. The input register flip-flops and the output register flip-flops are arranged serially also, but the clock signal provided is CLK2, not CLK1 which is supplied to the Control Register flip-flops. Thus, without the CLK2 signal, the Input Register and Output Register are not clocked and do not move in a serial fashion.

From the slave part of master slave flip-flop MS1 two copies of the TST signal are produced after the next occurrence of the system clock CLK0. One of these signals provides one of the inputs to the NAND gates 60 through 83. These NAND gates require affirmative inputs from their associated control register bits CR0-23 in order to produce active output and provide the "F" signals F0-23 seen on those lines in FIG. 1. The use of these F signals can be seen along with their complements, $F_xB$, in FIG. 1. The control or "F" signals from the Control Register are generated by NAND gates 60-83 (some of which are not shown to save drawing space). As stated before, the inputs to them are the outputs from flip-flops CR0-CR23, respectively, and the TST copy signal from the slave part of flip-flop MS1. In the preferred embodiment F signals F0-15 are user definable, and may be used to control any function on the ASIC as desired by the design. F16 selectively links the Core Logic Out (CLO) to the output buffer or the output register output QO to the output buffer OB.

F17B connects Input Register Input (or output from the previous bit through SI) to core logic at CLI. F18, F17B and F20/F20B work together to either provide a path for serial shift between Input Register flip-flops (QI to SI); or a path from the Pin to the Input Register Input (P to SI); or a path from the previous QI (from a previous flip-flop not shown) to the SI (shown in FIG. 1.) to Core Logic at CLI. Wherever the Input Register output QI is not connected to CLI, the Pin input is. F19 allows the output buffer OB of FIG. 1 to be included in the test path. The way this is done (see FIG. 1) is to allow the output (which may usually be from CLO) of the multiplexor 35 to go through the output buffer OB, appear at the pin P and appear back at gate 31.

F20 isolates the input register flip-flops from their next-in-line neighbors by shutting down gate 24. F21 enables the check-summing operation in the output register, allowing the S0 signal to be XORed with the output of gates 29 or 31. Bit zero of the Output Register is not in an I/O cell and contains an XOR tree which is also activated on signal F21 to XOR the outputs from bits 2, 11 and the most significant bit as described with reference to the output register aliasing solution above. F22 overrides the OEN signal, shutting off the output buffers OB. F23 forces the Output Buffers OB on regardless of the output enable signal OEN, or the F22 signal.

Use of Test Strobe Early and Test Clock Enable Early Signals

Two advantages become available through the use of these early signals.

First, by having a separate signal path for special functions, you do not need to use buffers as large as would be necessary if no early signals were provided. Therefore there is less loading.

Second, these early signals can be used to perform various functions where an initialization of certain circuits is required, such as to set all storage elements of a certain type to a known valid logic level (one or zero).

In the preferred embodiment, these early signals are taken from the master-slave flip-flops (MS1, MS2 of FIG. 1) from the master portion's output. In other words, the input signal appears at the output with no clock delay.

Thus, when these signals are brought to an initialization input, a hardwired 1 or 0 can be forced into the flip-flops being initialized. At such a point, the initialized flip-flops can receive test data, the first datum to be received as test output being the chip identification hardwired into the control register, after the continuous string of either zeros or ones from the initialization step. This is the first use to which these early signals, Test Clock Enable (TCE) early and Test Strobe (TST) early, are put in the preferred embodiment.

Clock Monitor

Ordinarily in a module or circuit board all the chips are fed from a single clock at the same time from a single fanout point or multiple fan out points on that module or card. Where large variations are present between the amount of loading in the different chips in a module or card the clock skew produced by the clock pulse traveling through the card can be significantly different from chip to chip on the same module. In order to design coordinated circuits, measurement of clock skew must be available. Also, to ensure the proper functioning of the circuits in a card or module, the clock skew must fit within a certain range of variability, and this must be testable. In the prior art, measurement of clock skew could be taken from the clock input pin to the chip. In this design a special clock monitoring pin is dedicated to the task and allows measurement of single chip clock delay as well as the variation in skew between chip clock monitor outputs. The system clock input is wired to the clock fanout bus and this bus is tied not only to the core logic deep within the chip but also to the dedicated clock monitoring pin. Thus the loading of the circuit affects the skew monitor directly.

Referring back to FIG. 2, pin P3 receives clock input CLK0 which provides clock pulses to the clock bus CLB. Clock skew is measured at pin P4 which is connected to the clock bus CLB by line 49. This gives an accurate measure of the skew due to loading in the core logic area which receives the signal CLK0.

Serial Path Registration

Referring back to FIG. 6, note that the TDI register clocks in a stream of serial data into Control Register CR0 which is serially clocked through the control register into the Input Register or may be clocked directly through IRI copy or IRI inputs into the Input Register. The test data input flip-flop TDI reg is a clocked register allowing less stringent timing requirements to be imposed on its off chip input signal. The flip-flop TDI Reg allows the test data input to be clocked in, instead of having to be fed down the entire length of wire to the pin before getting into the control register or input register bits. This prevents the occurrence timing problems which existed in the prior art.

Selective Enablement of Output Register Pin

In order to be able to output data from scan path flip-flops at any time through the test data output TDO (which normally is employed only during test mode to output the final flip-flop in the serial scan path), the final bit of the output register is input together with control signals to a test data output flip-flop TDO reg and continually provided at the test data output pin.

Figure 7:
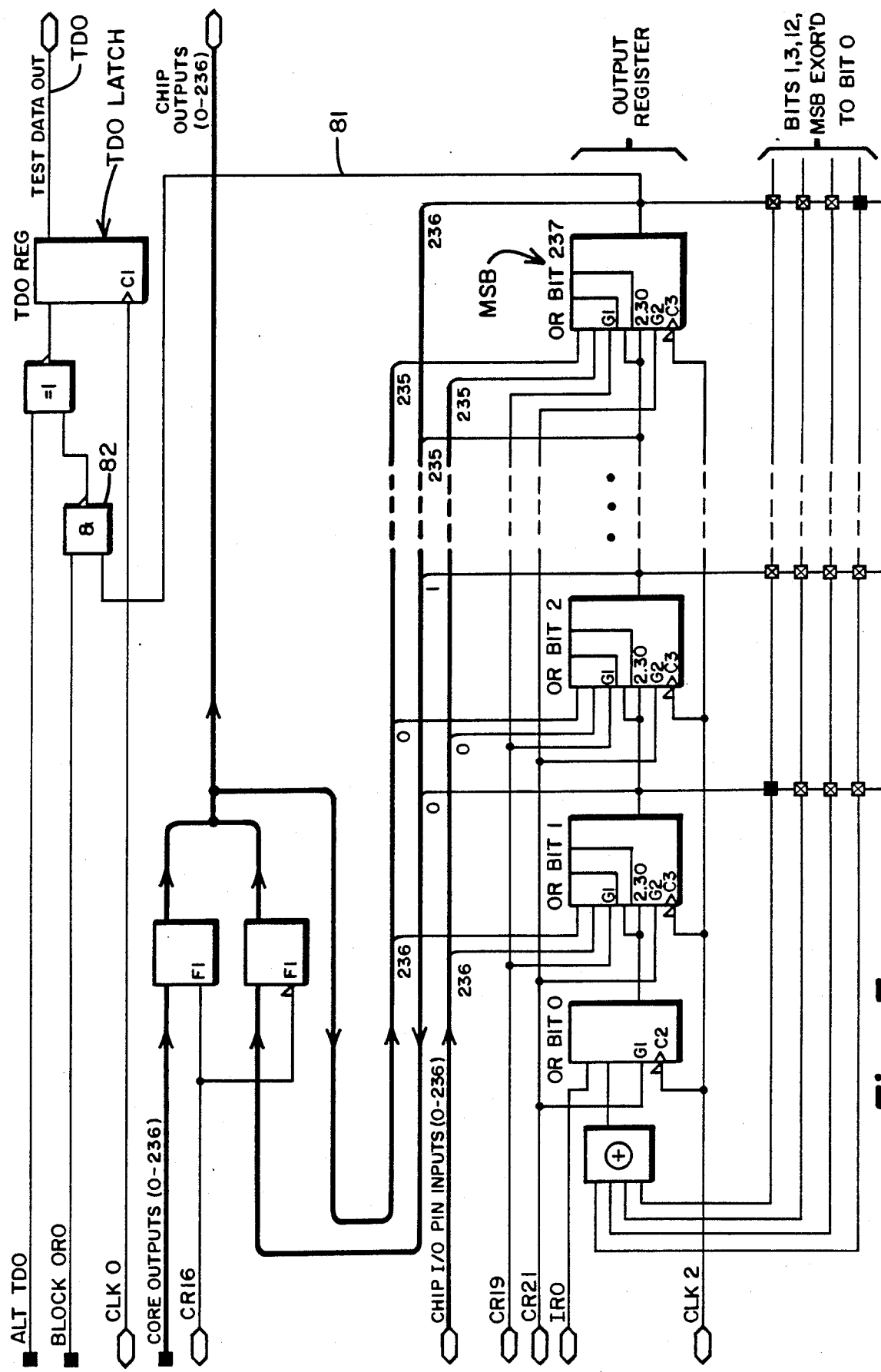
FIG. 7 is a logic diagram showing the Test Data Out latch and its association with the Output Register.

Referring to FIG. 7, a logic diagram of the output register bits OR 0, OR 1, OR 2, and OR 237, the test data out register TDO reg is shown at the top of the diagram. The ALT TDO signal may be a copy of the test data output signal provided b the last register in the serial scan path. The ALTTDO signal may be provided from anywhere in the core logic. This may be especially useful for implementing other forms of scan path output, or exclusive ORing the scan path output with the output register output. These registers are discussed earlier and are ordinarily located somewhere within the core logic or around the border. The block OR0 line selectively blocks output from line 81 (from the most significant bit of the output register) from reaching the test data output register via its input to NAND gate 82. The user configurable portion of the logic will determine the state of the block OR0 line.

In General

The features described in this patent are useful not only to enhance testability but at the same time to do so in such a way that limited amount of silicon real estate is employed. By ensuring that the testability is taken care of before user customizable design is begun in a manner which is unchanging from ASIC to ASIC, the design of such chips is made easier. A big factor in this is the provision of I/O cells at every pin around the periphery of the chip. Not all of these pins are employed by the input register/output register and control register. A certain number of them, (depending on the number of pins required by the application that the chip is being designed for and the requirements of the input register/output register and control register) are used to satisfy the testability requirements of that application. In such cases more or less I/O cells will be available for direct output from and input to the core logic area on the chip. The core logic is generally not contained physically in the chip periphery, whereas most of the circuitry discussed in detail in this patent is located there. A scan path testing design other than that used by the invention may also be easily used with this invention, without consuming additional I/O pins. Output from the output buffer may be had in a serial stream also through the test data output pin or it may be received in a parallel manner from the output register through the output register pins.

What is claimed is:

1. A VLSI circuit having a built-in test and maintenance system and wherein essentially all of the signal inputs and outputs go through unit I/O cells comprising:
   output buffer means, connected to provide output from the on-chip circuits to chip pins;
   input buffer means, connected to provide input from chip means to the on-chip circuits; and
   an output register and a core logic, wherein the output buffer is connected to selectively receive input either from said output register or directly from core logic;
   wherein the output register is a serial shift register having the data output from each less significant bit fed forward into each next more significant bit during serial shift, and wherein each fed forward signal is selectively disablable so that each said next more significant bit receives instead said fed forward signal logically XORed with one input signal bit from the core logic for each fed forward signal and wherein the most significant bit is fed back into the least significant bit, forming a ring.

2. In a VLSI circuit/ as set forth in claim 1 and having an input register; I/O cells as set forth in claim 1, wherein said input buffer can selectively provide input to core logic or to an input register, or to both.

3. In a VLSI circuit as set forth in claim 2, I/O cells as set forth in claim 2 wherein the core logic can selectively receive input from the input register or from the input buffer.

4. In a VLSI circuit as set forth in claim 3, I/O cells as set forth in claim 3 wherein said selectivity is controlled by signals supplied by a control register.

5. In a VLSI circuit as set forth in claim 2, I/O cells as set forth in claim 2 wherein said selectivity is controlled by signals supplied by a control register.

6. In a VLSI circuit, as set forth in claim 1 and having a control register; I/O cells as set forth in claim 1, wherein said selectivity is controlled by signals supplied by said control register.

7. In a VLSI circuit as set forth in claim 6 wherein said control register has only one data input from a pin.

8. A VLSI circuit having a built-in test and maintenance system and wherein essentially all of the signal outputs and outputs go unit I/O cells, comprising:

an output buffer means, connected to provide output from the on-chip circuits to chip pins;

an input buffer means, connected to provide input from chip pins to the on-chip circuits;

an output register and a core logic, wherein the output buffer is connected to selectively receive input either from said output register or directly from said core logic;

a control register, wherein said selectivity is controlled by signals supplied by said control register, said control register having only one data input from a pin; and a system clock input separated so as to be provided as a CLK 2 signal to the input register and the output register, and as a CLK 1 signal to the control register, and a disablement means provided to selectively disable the CLK 2 signal to allow the control register to be clocked without clocking either the input register or the output register.

9. A VLSI circuit having a built-in test and maintenance system and wherein essentially all of the signal inputs and outputs go through unit I/O cells, comprising:

an output buffer means, connected to provide output from the on-chip circuits to chip pins;

an input buffer means, connected to provide input from chip pins to the on-chip circuits; and at least one signal registration means having at least two outputs, and adapted to receive a mode select signal from off-chip and configured to pass said mode select signal with clocking on one of said outputs and earlier, without clocking, on the other output.

10. The VLSI circuit of claim 9 further including certain predetermined flip-flops for providing a set-up condition to achieve a particular state for the functioning of the chip wherein said earlier output is connected to provide a set-up signal to said predetermined filp-flops prior to receiving said clocked output.

11. A VLSI circuit having a built-in test and maintenance system and wherein essentially all of the signal inputs and outputs go through unit I/O cells, comprising:

an output buffer means, connected to provide output from the on-chip circuits to chip pins;

an input buffer means, connected to provide input from chip pins to the on-chip circuits; and at least one signal registration means having at least two outputs, and adapted to receive a test enable signal from off-chip, said registration means being configured to pass said test enable signal with clocking on one of said outputs and earlier, without clocking, on the other output.

12. The VLSI circuit of claim 11 further including certain predetermined flip-flops for providing a set-up condition to achieve a particular state for the functioning of the chip wherein said earlier output is connected to provide a set-up signal to said predetermined flip-flops prior to receiving said clocked output.

13. A VLSI circuit having a built-in test and maintenance system wherein essentially all of the signal inputs and outputs go through unit I/O cells, comprising:

an output buffer means, connected to provide output from the on-chip circuits to chip pins;

and input buffer means, connected to provide input from chip pins to the on-chip circuits; and a system clock input separated so as to be provided as a CLK 2 signal to the input register and the output register, and as a CLK 1 signal to the control register, and wherein a disablement means is provided to selectively disable the CLK 1 signal to allow the input and output registers to be serially loaded and unloaded without affecting the control register.

14. A VLSI circuit having a built-in test and maintenance system wherein essentially all of the signal inputs and outputs go through unit I/O cells, comprising:

an output buffer means, connected to provide output from the on-chip circuits to chip pins;

and input buffer means, connected to provide input from chip pins to the on-chip circuits; and a test data output pin selectively connectable to serially provided data from the core logic area, such as data from a scan path, or from the test data input and these may be logically XORed with output from the output register, through a test data output register.

15. A VLSI circuit having a built-in test and maintenance system wherein essentially all of the signal inputs and outputs go through unit I/O cells, comprising:

an output buffer means, connected to provide output from the on-chip circuits to chip pins;

and input buffer means, connected to provide input from chip pins to the on-chip circuits; and an input register, a test data input register and a core logic, wherein a shared input pin provides data to the test data input register for serially providing input data to the core logic and identical data to the input register, such as data to a scan path.

* * * * *